United States Patent

Hishida et al.

[11] Patent Number: 5,753,039
[45] Date of Patent: May 19, 1998

[54] MANUFACTURING METHOD OF P-TYPE SEMICONDUCTOR CRYSTAL

[75] Inventors: Yuji Hishida, Osaka; Tomoyuki Yoshie, Muko, both of Japan

[73] Assignee: Sanyo Electric Co., Ltd., Osaka-fu, Japan

[21] Appl. No.: 563,288

[22] Filed: Nov. 28, 1995

[30] Foreign Application Priority Data

| Nov. 29, 1994 | [JP] | Japan | 6-295349 |
| Aug. 23, 1995 | [JP] | Japan | 7-214911 |
| Sep. 28, 1995 | [JP] | Japan | 7-251461 |
| Oct. 18, 1995 | [JP] | Japan | 7-270214 |

[51] Int. Cl.$^6$ ............................................. C30B 15/14
[52] U.S. Cl. ........................... 117/104; 117/107; 438/918
[58] Field of Search ............................. 117/1, 107, 956, 117/104; 437/81, 82, 107; 438/918

[56] References Cited

U.S. PATENT DOCUMENTS

| 4,904,618 | 2/1990 | Neumark | 437/82 |
| 5,468,678 | 11/1995 | Nakamura et al. | 437/107 |
| 5,616,778 | 4/1997 | Toda et al. | 117/104 |

FOREIGN PATENT DOCUMENTS 406234599A  8/1994  Japan.

OTHER PUBLICATIONS

Journal of Crystal Growth 111 (1991) 797–801.
J. Appl. Phys. 58 (2), 15 Jul. 1985.
Doping of Nitrogen Acceptors into ZnSe Using a Radical Beam During MBE Growth, K. Ohkawa et al., *Journal of Crystal Growth III* (1991).

*Primary Examiner*—Felisa Garrett
*Attorney, Agent, or Firm*—Darby & Darby

[57] ABSTRACT

An object formed of a semiconductor is heated to and kept at such a temperature that a semiconductor crystal formed of a II–VI Group compound semiconductor mainly containing Zn and Se can be grown. A molecular beam including elements constituting the II–VI Group compound semiconductor mainly containing Zn and Se is irradiated onto the heated object, and a gas beam composed of a nitrogen molecule being in a ground electronic state and having a gas pressure of not less than $3\times10^{-5}$ Torr, to form a p-type semiconductor crystal on the object.

21 Claims, 8 Drawing Sheets

MANUFACTURING METHOD OF P-TYPE SEMICONDUCTOR CRYSTAL

BACKGROUND OF THE INVENTION

1. Field of the Invention

The present invention relates to a method of manufacturing a p-type semiconductor crystal, and more particularly, to a method of manufacturing a p-type semiconductor crystal formed of a II–VI Group compound semiconductor containing Zn and Se by vapor phase epitaxy method.

2. Description of the Background Art

A II–VI Group compound semiconductor such as ZnSe, ZnSSe and MgZnSSe having a direct transition wide band gap has been actively studied because it can emit ultraviolet light to light in blue to green bands.

In a conventional doping method for bringing such a compound semiconductor into a p-type, active nitrogen such as nitrogen molecule ions, a nitrogen molecule radical, a nitrogen molecule in an excited electronic state, or nitrogen atoms in an excited electronic state which is excited by discharge and heating or light irradiation is used as a dopant. It is also reported that lithium or oxygen can be used as a dopant.

In a method using active nitrogen obtained by discharge as a dopant, a compound semiconductor of a p type obtained by doping active nitrogen using discharge relatively has reproducibility of characteristics. In this method, however, a nitrogen-gas cell incorporating a special discharge tube is required, thereby complicating a manufacturing apparatus. In addition, the range of doping conditions is narrow from the necessity of maintaining discharge. Therefore, it is difficult to dope the compound semiconductor to a desired concentration. Since a discharge is used to excite nitrogen gas, impurities attached to the inner wall or the like of the apparatus are sputtered by the discharge, whereby many undesirable impurities may be included in a crystal. Further, active nitrogen having high energy is incident on the crystal, whereby the crystallinity of the grown crystal may be degraded.

Also when active nitrogen obtained by irradiating light is utilized as a dopant, many undesirable impurities may be included in a crystal by the irradiating light.

On the other hand, in a method using lithium or oxygen as a dopant, a p-type compound semiconductor having lithium or oxygen doped therein has no reproducibility of characteristics.

SUMMARY OF THE INVENTION

An object of the present invention is to provide a method of manufacturing a p-type semiconductor crystal having a large margin of doping conditions and formed of a II–VI Group compound semiconductor containing Zn and Se in which undesirable impurities are hardly included by vapor phase epitaxy method using a simple apparatus.

Another object of the present invention is to provide a method of manufacturing a p-type semiconductor crystal having a large margin of doping conditions and formed of a II–VI Group compound semiconductor mainly containing Zn and Se in which almost no undesirable impurities are incorporated by molecular beam epitaxy method using a simple apparatus.

A method of manufacturing a p-type semiconductor crystal according to the present invention comprises the steps of heating an object to such a crystal growth temperature that a semiconductor crystal including a II–VI Group compound semiconductor containing Zn and Se can be grown, and irradiating a gas beam composed of nitrogen molecules in a ground electronic state and having a gas pressure of not less than $3 \times 10^{-5}$ Torr onto the heated object while growing the II–VI Group compound semiconductor containing Zn and Se as a crystal on the heated object by vapor phase epitaxy method to form a p-type semiconductor crystal on the object.

In the manufacturing method, the gas beam composed of nitrogen molecules in a ground electronic state and having a pressure of not less than $3 \times 10^{-5}$ Torr (that is, nitrogen molecules in an ground electronic state having directional properties toward the object) is irradiated onto the object while growing the II–VI Group compound semiconductor containing Zn and Se as a crystal on the object, whereby the p-type semiconductor crystal having a high acceptor concentration can be formed on the object with good reproducibility. In this case, it is considered that nitrogen is satisfactorily incorporated into the crystal because nitrogen molecules are in a ground electronic state and have directional properties and enough gas pressure. The nitrogen satisfactorily incorporated forms an acceptor level, whereby the p-type semiconductor crystal having a high acceptor concentration can be formed.

According to the manufacturing method, nitrogen molecules which are dopant gas need not be excited to an electron excited state, whereby no special operation such as discharge is required. As a result, a manufacturing apparatus is simplified, and the range of doping conditions can be widen.

Moreover, no energy for exciting nitrogen molecules to an electron excited state is supplied, whereby undesirable pollution by impurities of the crystal can be reduced, and the energy of nitrogen molecules incident on the object is small. As a result, the crystallinity of the grown crystal is improved.

Particularly, it is preferable that the vapor phase epitaxy method is molecular beam epitaxy method, and the step of irradiating the gas beam comprises the step of irradiating a molecular beam including elements constituting the II–VI Group compound semiconductor onto the object. In this case, the molecular beam including elements constituting the II–VI Group compound semiconductor and the gas beam composed of nitrogen molecules also have directional properties, whereby it is considered that nitrogen is satisfactorily doped in the crystal.

The II–VI Group compound semiconductor may be ZnSe, ZnSSe, ZnSeTe, ZnSSeTe or MgZnSSe.

When the gas pressure of the gas beam is not less than $3 \times 10^{-5}$ Torr and not more than $1 \times 10^{-3}$ Torr, a p-type semiconductor crystal which can be sufficiently utilized is obtained. Particularly, it is preferable that the gas pressure of the gas beam is not more than $1.5 \times 10^{-4}$ Torr. Consequently, the crystallinity of the p-type semiconductor crystal becomes good. It is preferable that the gas pressure of the gas beam is not less than $8 \times 10^{-5}$ Torr. In this case, the acceptor concentration of the p-type semiconductor crystal becomes a high concentration of not less than $1 \times 10^{17}$ cm$^{-3}$. It is more preferable that the gas pressure of the gas beam is not less than $1 \times 10^{-4}$ Torr. In this case, the acceptor concentration of the p-type semiconductor crystal can be a higher concentration of not less than $2 \times 10^{17}$ cm$^{-3}$.

When the crystal growth temperature is not less than approximately 180° C. and not more than approximately 600° C., a p-type semiconductor crystal which can be sufficiently utilized is obtained. Particularly, it is preferable that the crystal growth temperature is not less than approximately 230° C. and not more than approximately 400° C. Consequently, the acceptor concentration is increased.

The object may be a single crystal semiconductor substrate. It is preferable that the p-type semiconductor crystal is formed on a plane misoriented from a crystal face with a low index of the single crystal semiconductor substrate. Consequently, it is possible to further increase the acceptor concentration of the p-type semiconductor crystal.

Additionally, it is preferable that the misoriented plane is misoriented by more than 0 degree and not more than 15 degrees from the crystal face with a low index. Particularly, it is preferable that the misoriented plane is misoriented by not less than 5 degrees and not more than 15 degrees from the crystal face with a low index. Consequently, it is possible to significantly increase the acceptor concentration.

Preferably, the single crystal semiconductor substrate is a GaAs substrate, and the p-type semiconductor crystal is formed on a plane misoriented from a (100) plane of the GaAs substrate. Particularly, it is preferable that the misoriented plane is misoriented in a direction [0-11] from the (100) plane. Consequently, the acceptor concentration is further increased.

The object may be a semiconductor layer formed on the single crystal semiconductor substrate. Particularly, it is preferable that the semiconductor layer has a plane misoriented from the crystal face with a low index.

It is preferable that the p-type semiconductor crystal has an acceptor concentration of not less than $1 \times 10^{17}$ cm$^{-3}$. It is more preferable that the p-type semiconductor crystal has an acceptor concentration of not less than $2 \times 10^{17}$ cm$^{-3}$.

The object may be formed of a semiconductor. The object may be formed of single crystal.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
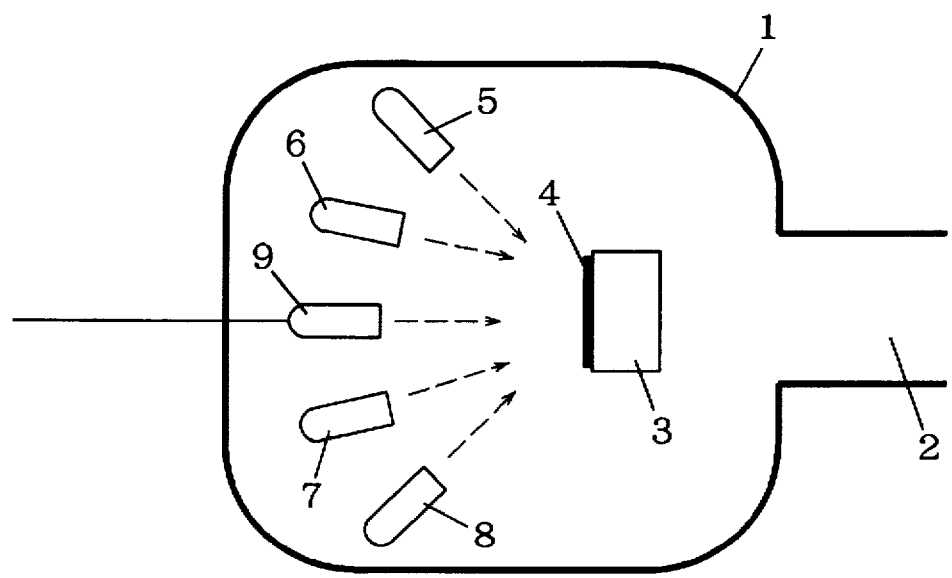
FIG. 1 is a typical diagram showing the construction of an MBE apparatus used in one embodiment of the present invention.

Description is made of a method of manufacturing a p-type semiconductor crystal formed of a II-VI Group compound semiconductor mainly containing Zn and Se according to one embodiment of the present invention. FIG. 1 is a typical diagram showing the construction of an MBE (Molecular Beam Epitaxy) apparatus used for manufacturing a p-type semiconductor crystal in the present embodiment.

In FIG. 1, a substrate holder 3 for supporting a substrate (an object) 4 is disposed in a vacuum container 1. The substrate holder 3 heats the substrate 4 to keep the substrate 4 at a desired crystal growth temperature. Cells 5, 6, 7 and 8 are disposed as molecular beam sources for irradiating molecular beams onto the surface of the substrate 4 in the vacuum container 1. High-purity Zn (zinc), high-purity Se (selenium), high-purity ZnS and high-purity Mg (magnesium) are respectively housed in the cells 5, 6, 7 and 8. Further, a nitrogen molecule gas cell 9 for irradiating nitrogen molecule gas onto the surface of the substrate 4 simultaneously with a desired molecular beam out of the above-mentioned molecular beams is disposed in the vacuum chamber 1. An exhaust hole 2 of the vacuum container 1 is connected to a vacuum pump (not shown) for evacuating the vacuum chamber 1.

The nitrogen molecule gas cell 9 is connected to a gas cylinder (not shown) containing nitrogen molecules ($N_2$) and emits the nitrogen molecules without performing processing.

Description is now made of one example of a method of manufacturing a p-type ZnSe crystal using the MBE apparatus shown in FIG. 1.

A GaAs semiconductor substrate is first mounted as the substrate 4 on the substrate holder 3, after which the vacuum container 1 is preferably evacuated to a high vacuum of approximately $10^{-9}$ Torr. Thereafter, the cells 5 and 6 are heated in a state where the substrate 4 is kept at a crystal growth temperature (a substrate temperature) of 260° C., to irradiate a molecular beam including Zn having a pressure of $1 \times 10^{-7}$ Torr and a molecular beam including Se having a pressure of $2 \times 10^{-7}$ Torr which are respectively emitted from the cells 5 and 6 onto the surface of the substrate 4 as well as to irradiate nitrogen molecule gas composed of nitrogen molecules ($N_2$) in a ground electronic state having a pressure of $1 \times 10^{-4}$ Torr which is emitted from the nitrogen molecule gas cell 9 (that is, a gas beam composed of nitrogen molecules ($N_2$) in a ground electronic state having a pressure of $1 \times 10^{-4}$ Torr which is emitted from a nozzle of the nitrogen molecule gas cell 9) onto the surface of the substrate 4.

A p-type ZnSe crystal layer having nitrogen doped therein was thus grown on the surface of the substrate 4.

The acceptor concentration of the p-type ZnSe crystal layer which was found by the capacitance-voltage characterizing method is approximately $2 \times 10^{17}$ cm$^{-3}$. The nitrogen concentration of the p-type ZnSe crystal layer which was found by SIMS (secondary ion mass spectroscopy) is also approximately $2 \times 10^{17}$ cm$^{-3}$.

Since the acceptor concentration and the nitrogen concentration are approximately equal to each other, almost all of nitrogen accepted in the crystal act as acceptors, whereby it is found that the activation efficiency thereof is good.

Figure 2:
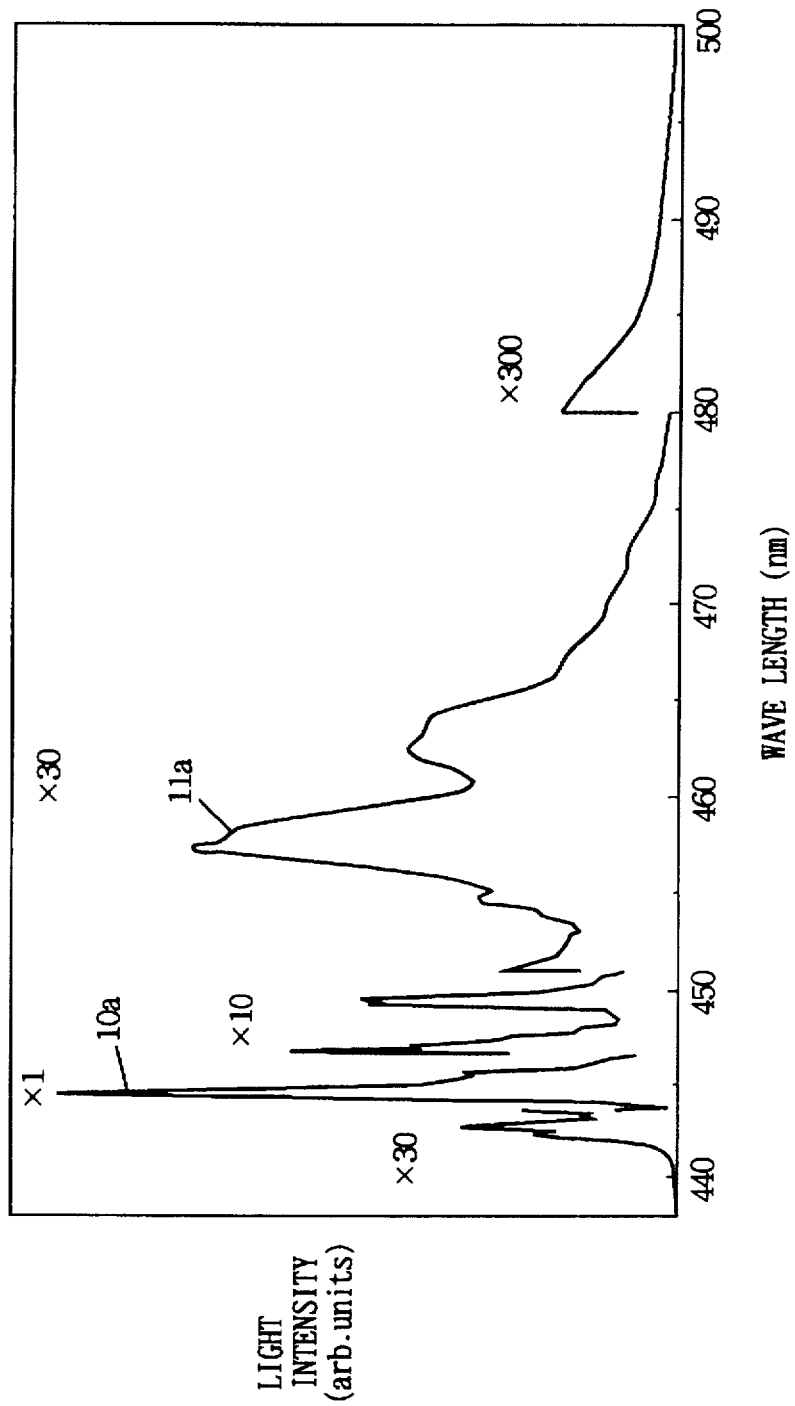
FIG. 2 is a diagram showing the PL spectrum of a p-type ZnSe crystal layer fabricated by a method according to the above-mentioned embodiment.
Figure 3:
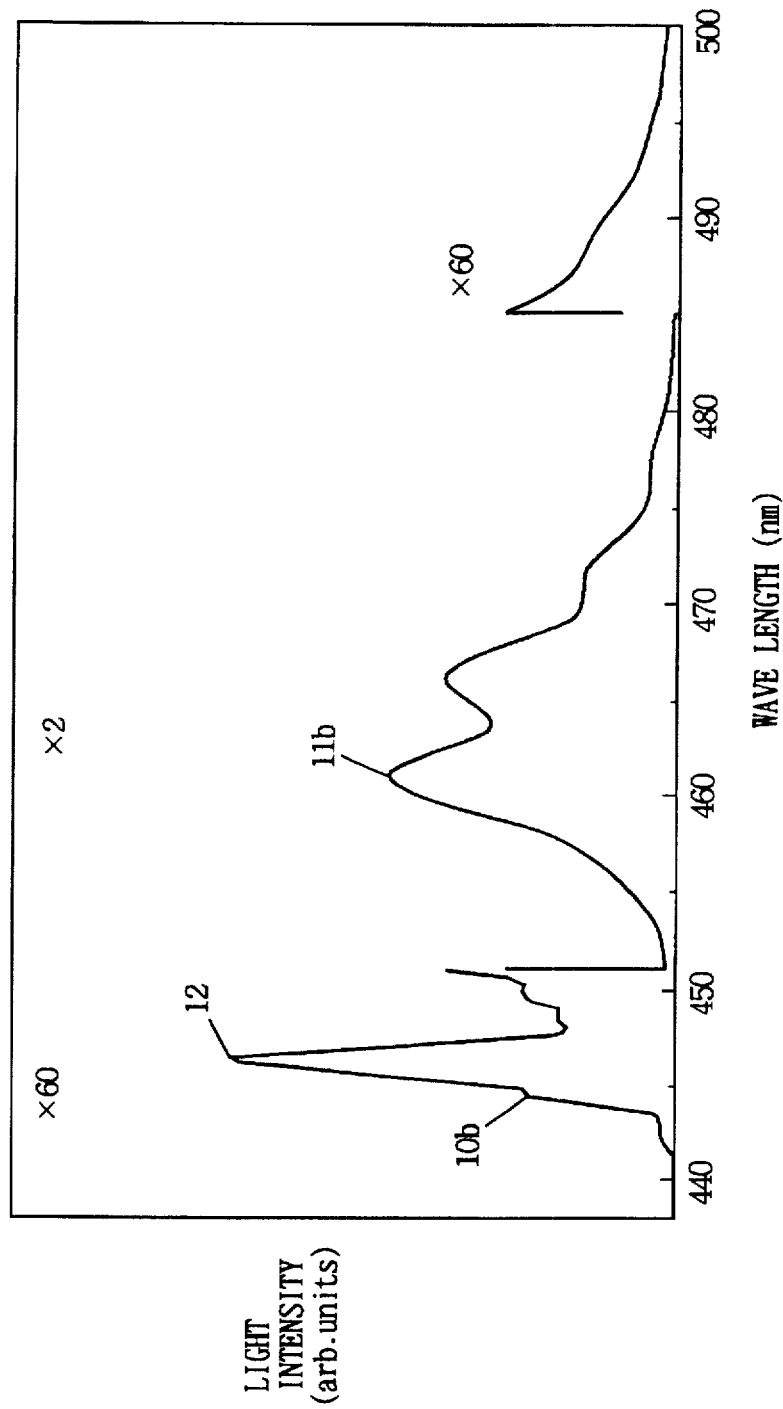
FIG. 3 is a diagram showing the PL spectrum of a p-type ZnSe crystal layer fabricated by a conventional method.

FIG. 2 shows the PL (photoluminescence) spectrum of a p-type ZnSe crystal layer fabricated by the method according to the present embodiment. FIG. 3 shows the PL spectrum of a p-type ZnSe crystal layer fabricated by a conventional method using doping of plasma-excited active nitrogen. The p-type ZnSe crystal layers in the present embodiment and the conventional example have the same acceptor concentration. In FIGS. 2 and 3, 10a and 10b denote excitonic emissions A captured by nitrogen acceptors, 11a and 11b denote donor to acceptor pair (DAP) emissions B caused by nitrogen acceptors and residual impurity donors, and 12 denotes an excitonic emission C caused by crystal defects.

As can be seen from FIGS. 2 and 3, the excitonic emission A in the present embodiment is approximately 250 times larger than that in the conventional example, while the emission B in the present embodiment is approximately one-tenth that in the conventional example. Further, the excitonic emission C seen in the conventional example cannot be found in the present embodiment.

As can be seen from the foregoing, the p-type ZnSe crystal layer in the present embodiment is superior in crystallinity to the p-type ZnSe crystal layer in the conventional example, and hardly incorporates undesirable impurities.

Figure 4:
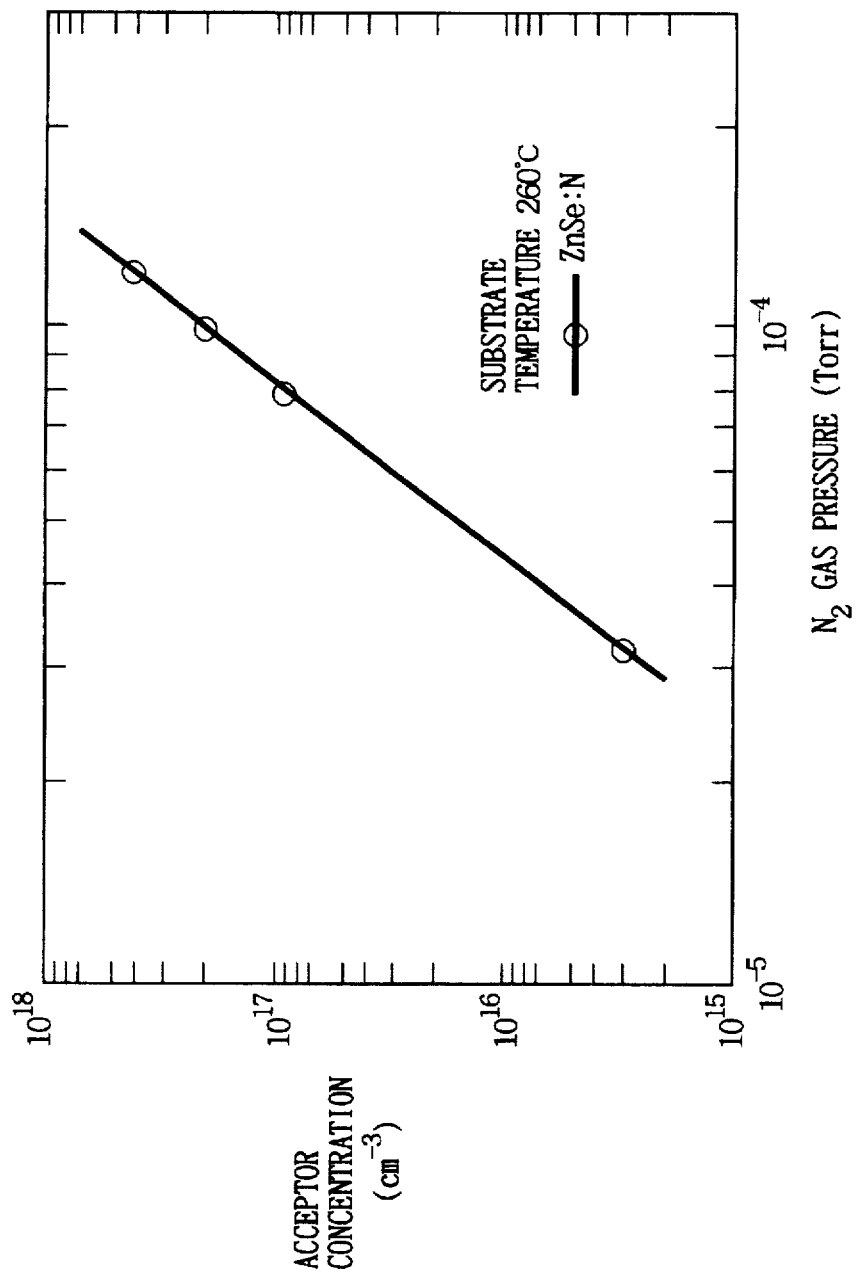
FIG. 4 is a diagram showing the relationship between the pressure of nitrogen molecule gas and the acceptor concentration of a grown p-type ZnSe crystal layer in the above-mentioned embodiment.

The pressure of the above-mentioned nitrogen molecule gas in an ground electronic state (that is, the gas pressure of a gas beam composed of nitrogen molecules in an ground electronic state) was changed, to examine the relationship between the pressure and the acceptor concentration. The results thereof are shown in FIG. 4. The conditions other than the gas pressure of the gas beam composed of nitrogen molecules are the same as the above-mentioned conditions.

As can be seen from FIG. 4, when the gas pressure of the gas beam composed of nitrogen molecules is changed from approximately $3.2 \times 10^{-5}$ Torr to approximately $1.2 \times 10^{-4}$ Torr, the acceptor concentration is changed from $3 \times 10^{15}$ cm$^{-3}$ to $4 \times 10^{17}$ cm$^{-3}$. Therefore, the relationship indicates that the acceptor concentration of the p-type ZnSe crystal layer is proportional to approximately the 3.7-th power of the gas pressure of the gas beam composed of nitrogen molecules. Consequently, it is found that the p-type ZnSe crystal layer having a desired acceptor concentration can be easily obtained with good reproducibility by controlling the gas pressure of the gas beam composed of nitrogen molecules.

Furthermore, it is found that a high acceptor concentration of not less than $1 \times 10^{17}$ cm$^{-3}$ which is considered to be generally required to fabricate a device, for example, when the gas pressure of the gas beam composed of nitrogen molecules is not less than $8 \times 10^{-5}$ Torr, and a high acceptor concentration of not less than $2 \times 10^{17}$ cm$^{-3}$ which is more preferable in fabrication of a device, for example, when the gas pressure of the gas beam composed of nitrogen molecules is not less than $1 \times 10^{-4}$ Torr.

Figure 5:
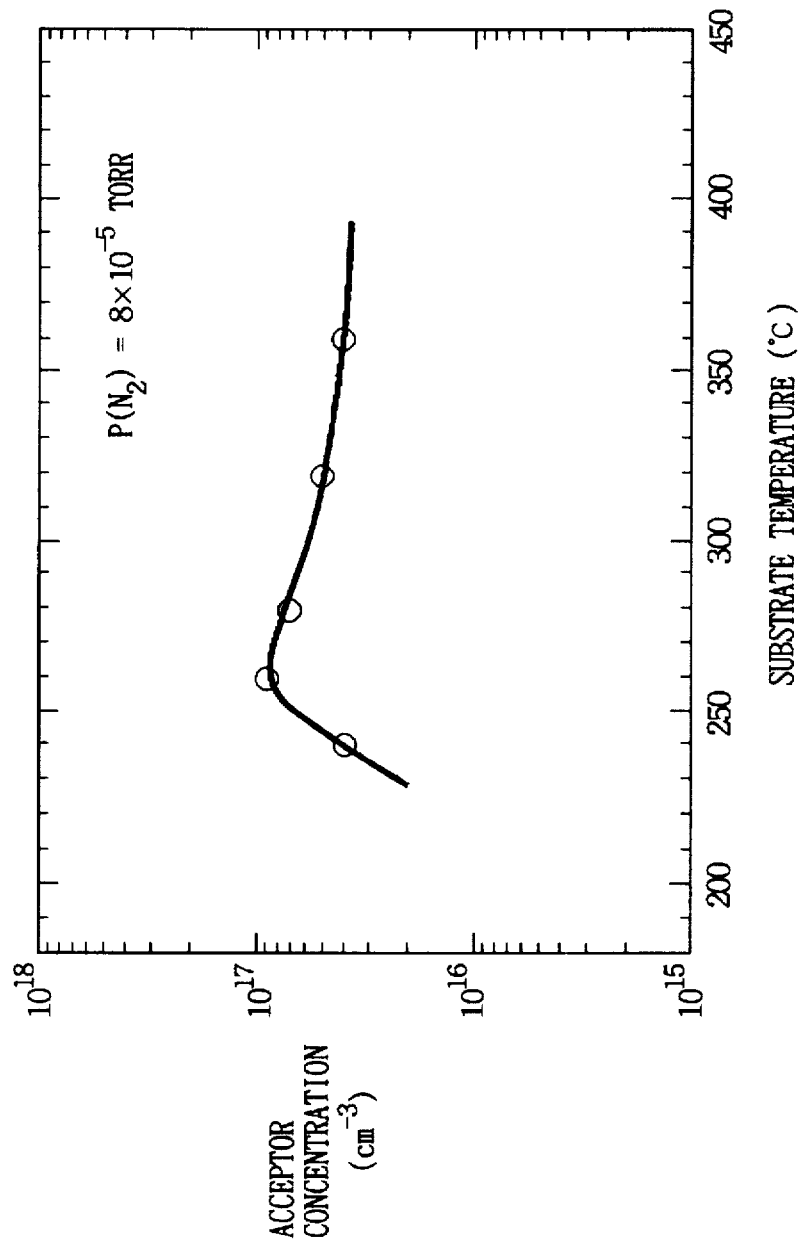
FIG. 5 is a diagram showing the relationship between the substrate temperature and the acceptor concentration of a grown p-type ZnSe crystal layer in the above-mentioned embodiment.

Furthermore, the above-mentioned crystal growth temperature was changed, to examine the relationship between the temperature and the acceptor. The results are shown in FIG. 5. The pressure of nitrogen molecule gas is $8 \times 10^{-5}$ Torr. The other conditions are the same as the above-mentioned conditions.

FIG. 5 shows that the acceptor concentration is more than $10^{16}$ cm$^{-3}$ in a range in which the crystal growth temperature is not less than approximately 230° C. and not more than approximately 400° C. In addition, a p-type ZnSe crystal is obtained in a range in which the crystal growth temperature is not less than approximately 180° C. and not more than approximately 600° C., which is not illustrated.

Although in the above-mentioned example, a case where the pressure of a molecular beam including Zn is $1 \times 10^{-7}$ Torr and the pressure of a molecular beam including Se is $2 \times 10^{-7}$ Torr, that is, the VI/II ratio is 2 is shown, the same results are obtained even in a case where the pressure of a molecular beam including Zn is $1.2 \times 10^{-7}$ Torr and the pressure of a molecular beam including Se is $1.8 \times 10^{-7}$ Torr, that is, the VI/II ratio is 1.5.

Furthermore, if the pressure of each of the molecular beams is in a range in which a ZnSe crystal can be grown and the pressure of nitrogen molecule gas is not less than $3 \times 10^{-5}$ Torr and not more than $1 \times 10^{-3}$ Torr, a P-type ZnSe crystal is obtained. When the pressure of nitrogen molecule gas is not more than approximately $2 \times 10^{-5}$ Torr, a P-type ZnSe crystal is not obtained. It becomes clear from the results of experiments by X-ray crystal diffractometry that as the pressure of nitrogen molecule gas becomes larger than $1.5 \times 10^{-4}$ Torr, the peak of X-rays diffraction is liable to deviate from the peak of the p-type ZnSe crystal, that is, the crystallinity of the p-type ZnSe crystal is liable to be degraded. Consequently, it can be said that the more preferable pressure of nitrogen molecule gas is not less than $3 \times 10^{-5}$ Torr nor more than $1.5 \times 10^{-4}$ Torr.

The following is one example of a method of manufacturing a p-type ZnSSe crystal using the MBE apparatus shown in FIG. 1.

Similarly to the foregoing, a GaAs semiconductor substrate is mounted as the substrate 4 on the substrate holder 3, after which the vacuum container 1 is preferably evacuated to high vacuum of approximately $10^{-9}$ Torr. Thereafter, the cells 5, 6 and 7 are heated in a state where the substrate 4 is kept at a crystal growth temperature of 260° C., to irradiate a molecular beam including Zn having a pressure of $1 \times 10^{-7}$ Torr, a molecular beam including Se having a pressure of $2 \times 10^{-7}$ Torr and a molecular beam including ZnS having a pressure of $5 \times 10^{-8}$ Torr which are respectively emitted from the cells 5, 6 and 7 onto the surface of the substrate 4 as well as to irradiate nitrogen molecule ($N_2$) gas in an ground electronic state having a gas beam pressure of $1 \times 10^{-4}$ Torr which is emitted from the nitrogen molecule gas cell 9 onto the surface of the substrate 4.

A p-type ZnSSe crystal layer superior in crystallinity having nitrogen doped therein can be thus grown with good reproducibility on the surface of the substrate 4. The acceptor concentration of the p-type ZnSSe crystal layer is approximately $2.5 \times 10^{17}$ cm$^{-3}$.

Figure 6:
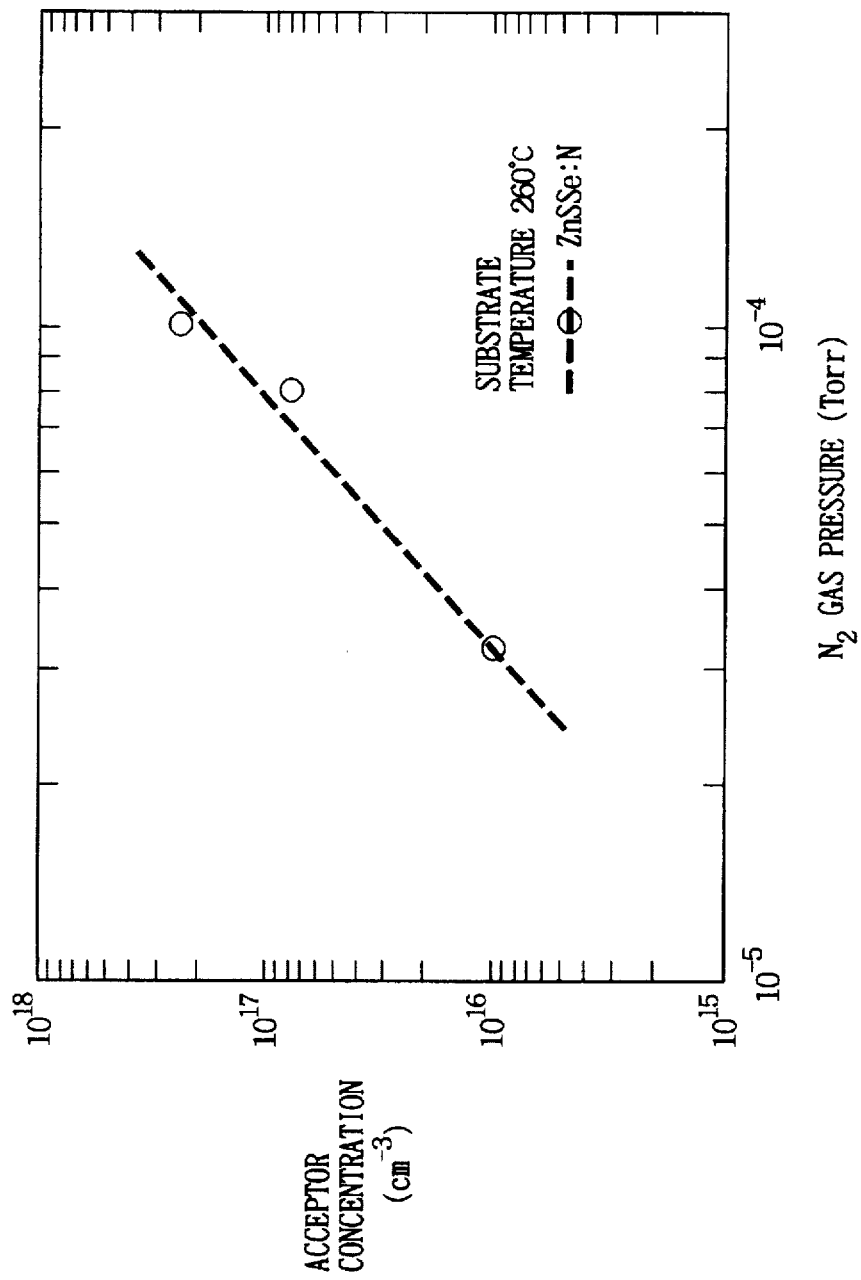
FIG. 6 is a diagram showing the relationship between the pressure of nitrogen molecule gas and the acceptor concentration of a grown p-type ZnSSe crystal in the above-mentioned embodiment.

Similarly in the case of this example, the pressure of nitrogen molecule gas in an ground electronic state (that is, the pressure of a gas beam composed of nitrogen molecules in an ground electronic state) was changed, to examine the relationship between the pressure and the acceptor concentration. The results are shown in FIG. 6. The conditions other than the pressure of nitrogen molecule gas are the same as the above-mentioned conditions.

FIG. 6 shows that the acceptor concentration of the p-type ZnSSe crystal layer is proportional to approximately the 2.7-th power of the pressure of nitrogen molecule gas, similarly to the acceptor concentration of the p-type ZnSe crystal layer. This indicates that the pressure of nitrogen molecule gas is controlled, to easily obtain other p-type II–VI Group compound semiconductor crystal layers having a desired acceptor concentration with good reproducibility as well as ZnSe.

Also in this case, it is found that a high acceptor concentration of not less than $1 \times 10^{17}$ cm$^{-3}$ which is considered to be generally required to fabricate a device, for example, when the gas pressure of the gas beam composed of nitrogen molecules is not less than $8\times10^{-5}$ Torr, and a high acceptor concentration of not less than $2\times10^{17}$ cm$^{-3}$ which is more preferable for fabrication of a device, for example, when the gas pressure of the gas beam composed of nitrogen molecules is not less than $1\times10^{-4}$ Torr.

Description is now made of a method of forming a p-type semiconductor crystal formed of a II–VI Group compound semiconductor mainly containing Zn and Se on a plane misoriented from a crystal face with a low index of a single crystal semiconductor substrate.

This example greatly differs from the above-mentioned examples in that the p-type semiconductor crystal is formed on a (100) plane of the GaAs substrate in the above-mentioned examples, while the p-type semiconductor crystal is formed on a plane misoriented from a (100) plane in this example. Even in this example, the p-type semiconductor crystal is fabricated in the following manner using the MBE apparatus shown in FIG. 1.

A GaAs semiconductor substrate is mounted as the substrate 4 on the substrate holder 3 so that a plane misoriented at a predetermined misoriented angle (off angle) from a (100) plane is a crystal growth plane, after which the vacuum container 1 is preferably evacuated to high vacuum of approximately $10^{-9}$ Torr. Thereafter, the cells 5 and 6 are heated in a state where the substrate 4 is kept at a crystal growth temperature (substrate temperature) of 260° C., to irradiate a molecular beam including Zn having a pressure of $1.2\times10^{-7}$ Torr and a molecular beam including Se having a pressure of $1.8\times10^{-7}$ Torr which are respectively emitted from the cells 5 and 6 onto the surface of the substrate 4 as well as to irradiate a gas beam composed of nitrogen molecules in an ground electronic state having a pressure of $8\times10^{-5}$ Torr which is emitted from the nitrogen molecule gas cell 9 onto the surface of the substrate 4.

A P-type ZnSe crystal layer having nitrogen doped therein was thus grown on the surface of the substrate 4.

Figure 7:
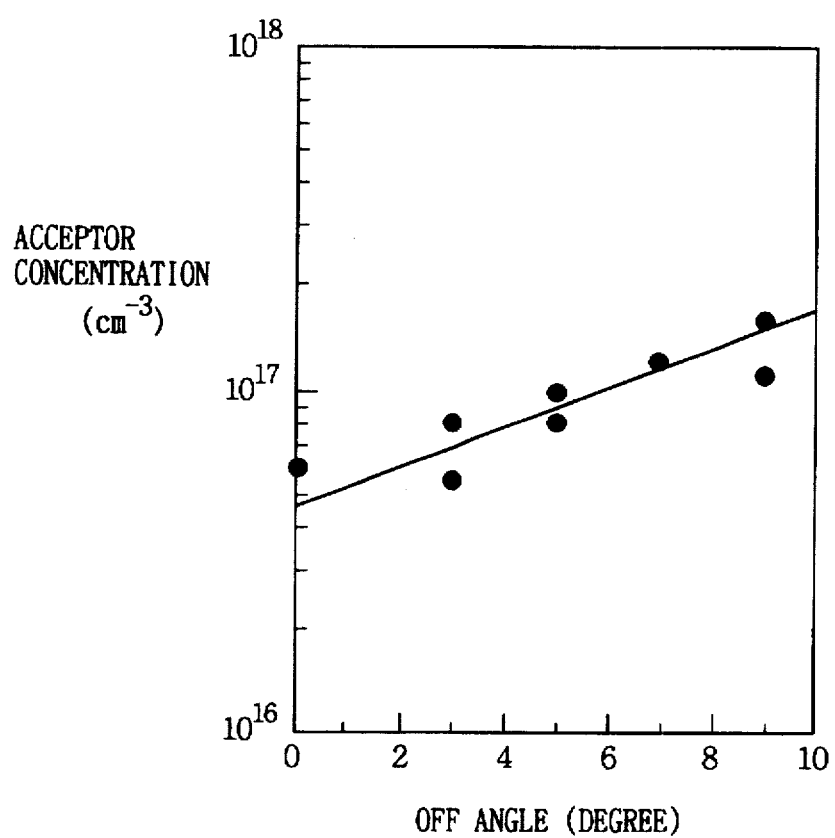
FIG. 7 is a diagram showing the relationship between the off angle of a GaAs substrate and the acceptor concentration of a p-type ZnSe crystal layer.

FIG. 7 is a diagram showing the relationship between the off angle of the above-mentioned acceptor concentration of the P-type ZnSe crystal layer grown as a crystal. In FIG. 7, the misoriented direction is a direction [110] from the (100) plane of the substrate 4.

FIG. 7 shows that the larger the off angle becomes, the larger the acceptor concentration of the p-type ZnSe crystal layer can be. Particularly when the off angle is not less than 5 degrees, a significant larger acceptor concentration is obtained, as compared with that in a case where the p-type ZnSe crystal layer is grown on the (100) plane.

The reason why the acceptor concentration is thus increased is conceivably that nitrogen is easily accepted in a crystal by the existence of many preferable steps of atom size on a crystal growth plane misoriented from a crystal face with a low index and the irradiation of nitrogen molecules in an ground electronic state having a predetermined temperature and a predetermined pressure.

Figure 8:
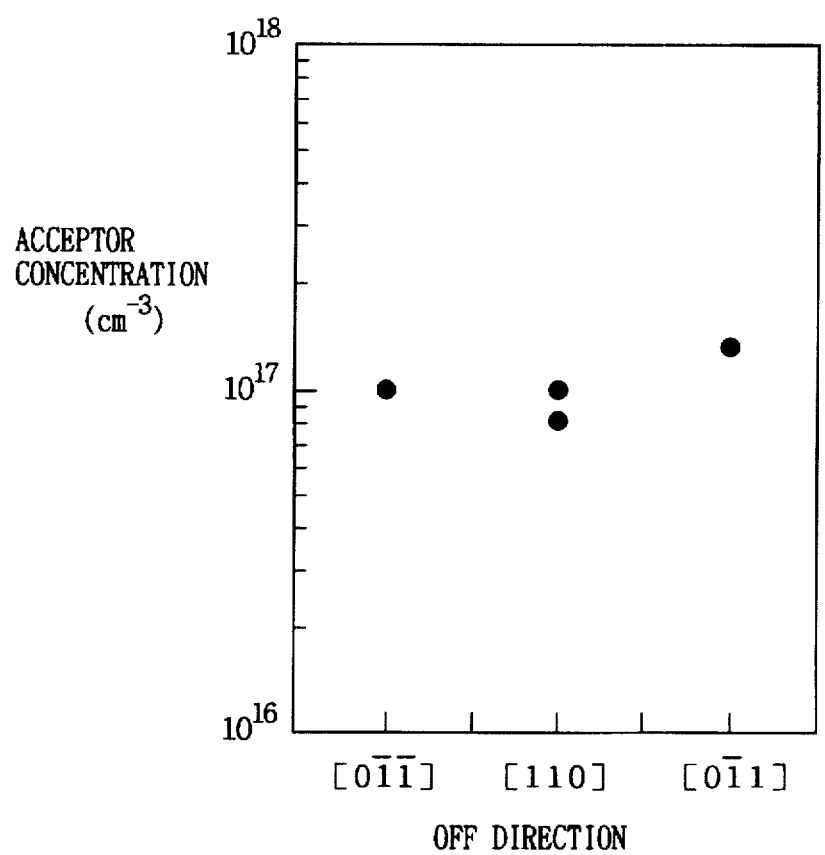
FIG. 8 is a diagram showing the relationship between the off direction of a GaAs substrate and the acceptor concentration of a p-type ZnSe crystal layer.

FIG. 8 is a diagram showing the relationship between the off direction of the above-mentioned substrate 4 and the acceptor concentration of the p-type ZnSe crystal layer grown as a crystal. In FIG. 8, the off angle is 5 degrees from the (100) plane of the substrate 4.

FIG. 8 shows that the acceptor concentration of the p-type ZnSe crystal layer can be increased, as in a case where the misoriented direction is a direction other than the direction [110]. Further, it can be said that a direction [0–11] from the (100) plane is preferable.

As can be seen from FIGS. 7 and 8, the p-type semiconductor crystal formed of the II–VI Group compound semiconductor mainly containing Zn and Se is thus formed on the plane misoriented from the crystal face with a low index of the single crystal semiconductor substrate, whereby the margin of doping conditions is large, the crystallinity of the p-type semiconductor crystal becomes good, and the acceptor concentration of the p-type semiconductor crystal can be increased. Particularly, it can be understood that the off angle of the misoriented plane is preferably not less than 5 degrees, and a plane misoriented by not less than 5 degrees from the (100) plane of the GaAs substrate is more preferable. When the off angle is increased so that the crystal growth plane approaches a crystal face with a high index, the crystallinity may be conversely degraded. Consequently, the off angle is preferably not more than approximately 15 degrees.

Although description was made of the methods of manufacturing the p-type ZnSe crystal and the p-type ZnSSe crystal, a p-type semiconductor crystal formed of a II–VI Group compound semiconductor mainly containing Zn and Se such as a p-type MgZnSSe crystal, a p-type ZnSeTe crystal or a p-type ZnSSeTe crystal can be also similarly manufactured with good crystallinity.

Furthermore, although in the above-mentioned embodiment, the GaAs substrate is used as the substrate, a semiconductor substrate formed of a II–VI Group compound semiconductor, a III–V Group compound semiconductor or the like can be suitably used. It goes without saying that a semiconductor layer formed of the same semiconductor may be used in place of the substrate. The substrate or the semiconductor layer may have conductivity by doping impurities.

Also in this case, the p-type carrier concentration can be increased by directly forming a p-type semiconductor layer on an off substrate using the method according to the present invention or forming a p-type semiconductor layer on a semiconductor layer formed of a II–VI Group compound semiconductor, a III–V Group compound semiconductor or the like formed on an off substrate using the method according to the present invention.

As described in the foregoing, according to the present invention, when a p-type semiconductor crystal formed of a II–VI Group compound semiconductor containing Zn and Se is fabricated by MBE, the semiconductor substrate or the semiconductor layer formed of a II–VI Group compound semiconductor, a III–V Group compound semiconductor or the like is heated to such a temperature that a semiconductor crystal formed of a II–VI Group compound semiconductor containing Zn and Se can be grown, and a molecular beam including elements constituting the above-mentioned II–VI Group compound semiconductor is irradiated onto the heated semiconductor substrate or the heated semiconductor layer and a gas beam composed of nitrogen molecules in an ground electronic state which is not active nitrogen before it is emitted from a cell (that is, a mere nitrogen molecule beam) is irradiated onto the semiconductor substrate or the semiconductor layer, whereby the p-type semiconductor crystal can be formed on the semiconductor substrate or the semiconductor layer.

Also in this case, if the pressure of each of the molecular beams is in a range in which the semiconductor crystal can be grown, it is preferable that the pressure of nitrogen molecule gas is not less than approximately $3\times10^{-5}$ Torr and not more than $1\times10^{-3}$ Torr and it is more preferable that the pressure of nitrogen molecule gas is not less than $3\times10^{-5}$ Torr and not more than $1.5\times10^{-4}$ Torr. It is preferable that the crystal growth temperature is in a range between approximately 180° C. and approximately 600° C.

Although the p-type semiconductor crystal according to the present invention is formed by irradiating a molecular beam including elements constituting the p-type semiconductor crystal, the molecular beam in the present invention, of course, includes a molecular beam in an atom state, and a desired molecular beam is suitably selected. Specifically, a molecular beam source can be suitably selected. Although in the above-mentioned example, an elementary substance such as Zn and Se is used as a source when the p-type ZnSe layer is formed, ZnSe may be used as a source. Further, Zn, S, Se, ZnS and ZnSe may be suitably combined as a source in forming the p-type ZnSSe crystal layer.

The expressions "crystal face" and "crystal direction" in the present specification include other relationships equivalent to the relationship between the crystal face and the crystal direction.

Although the present invention has been described and illustrated in detail, it is clearly understood that the same is by way of illustration and example only and is not to be taken by way of limitation, the spirit and scope of the present invention being limited only by the terms of the appended claims.

Although a GaAs semiconductor substrate is used as an object in the above embodiments, other semiconductors, for example, single crystal semiconductor such as ZnSe may be used as an object. Also, other single crystal materials such as diamond or sapphire may be used for an object.

What is claimed is:

1. A method of manufacturing a p-type semiconductor crystal, comprising the steps of:

heating an object to such a crystal growth temperature that a semiconductor crystal including a II–VI Group compound semiconductor containing Zn and Se can be grown; and irradiating a gas beam composed of nitrogen molecules in a ground electronic state and having a gas pressure of not less than $3 \times 10^{-5}$ Torr onto said heated object while growing the II–VI Group compound semiconductor containing Zn and Se as a crystal on said heated object by vapor phase epitaxy method, to form a p-type semiconductor crystal on said object.

2. The method according to claim 1, wherein said vapor in phase epitaxy method is molecular beam epitaxy method, and said step of irradiating the gas beam comprises the step of irradiating a molecular beam including elements constituting said II–VI Group compound semiconductor onto said object.

3. The method according to claim 1, wherein said II–VI Group compound semiconductor is ZnSe, ZnSSe, ZnSeTe, ZnSSeTe or MgZnSSe.

4. The method according to claim 1, wherein the gas pressure of said gas beam is not less than $3 \times 10^{-5}$ Torr and not more than $1 \times 10^{-3}$ Torr.

5. The method according to claim 4, wherein the gas pressure of said gas beam is not less than $3 \times 10^{-5}$ Torr and not more than $1.5 \times 10^{-4}$ Torr.

6. The method according to claim 4, wherein the gas pressure of said gas beam is not less than $8 \times 10^{-5}$ Torr and not more than $1 \times 10^{-3}$ Torr.

7. The method according to claim 6, wherein the gas pressure of said gas beam is not less than $1 \times 10^{-4}$ Torr and not more than $1 \times 10^{-3}$ Torr.

8. The method according to claim 1, wherein said crystal growth temperature is not less than approximately 180° C. and not more than approximately 600° C.

9. The method according to claim 8, wherein said crystal growth temperature is not less than approximately 230° C. and not more than approximately 400° C.

10. The method according to claim 1, wherein said object is a single crystal semiconductor substrate.

11. The method according to claim 10, wherein said p-type semiconductor crystal is formed on a plane misoriented from a crystal face with a low index of said single crystal semiconductor substrate.

12. The method according to claim 11, wherein said misoriented plane is misoriented by more than 0 degree and not more than 15 degrees from said crystal face with a low index.

13. The method according to claim 12, wherein said misoriented plane is misoriented by not less than 5 degrees and not more than 15 degrees from said crystal face with a low index.

14. The method according to claim 11, wherein said single crystal semiconductor substrate is a GaAs substrate, and said p-type semiconductor crystal is formed on a plane misoriented from a (100) plane of said GaAs substrate.

15. The method according to claim 14, wherein said misoriented plane is misoriented in a direction [0–11] from the (100) plane.

16. The method according to claim 1, wherein said object is a semiconductor layer formed on the single crystal semiconductor substrate.

17. The method according to claim 16, wherein said semiconductor layer has a plane misoriented from the crystal face with a low index.

18. The method according to claim 1, wherein said p-type semiconductor crystal has an acceptor concentration of not less than $1 \times 10^{17}$ cm$^{-3}$.

19. The method according to claim 18, wherein said p-type semiconductor crystal has an acceptor concentration of not less than $2 \times 10^{17}$ cm$^{-3}$.

20. The method according to claim 1, wherein said object is formed of a semiconductor.

21. The method according to claim 1, wherein said object is formed of single crystal.

* * * * *